(12) United States Patent
Kulkarni et al.

(10) Patent No.: US 11,174,557 B2
(45) Date of Patent: Nov. 16, 2021

(54) THERMAL BARRIER COATING SYSTEM COMPATIBLE WITH OVERLAY

(71) Applicant: Siemens Aktiengesellschaft, Munich (DE)

(72) Inventors: Anand A. Kulkarni, Charlotte, NC (US); Atin Sharma, Ewing, NJ (US)

(73) Assignee: Siemens Energy Global GmbH & Co. KG, Munich (DE)

( * ) Notice: Subject to any disclaimer, the term of this patent is extended or adjusted under 35 U.S.C. 154(b) by 171 days.

(21) Appl. No.: 16/478,301

(22) PCT Filed: Jan. 30, 2018

(86) PCT No.: PCT/US2018/015860
§ 371 (c)(1),
(2) Date: Jul. 16, 2019

(87) PCT Pub. No.: WO2018/140918
PCT Pub. Date: Aug. 2, 2018

(65) Prior Publication Data
US 2019/0368051 A1    Dec. 5, 2019

Related U.S. Application Data

(60) Provisional application No. 62/452,124, filed on Jan. 30, 2017.

(51) Int. Cl.
*C23C 28/04* (2006.01)
*C23C 28/00* (2006.01)
(Continued)

(52) U.S. Cl.
CPC ............ *C23C 28/3455* (2013.01); *B22F 3/24* (2013.01); *B22F 10/20* (2021.01); *B23K 26/342* (2015.10);
(Continued)

(58) Field of Classification Search
CPC .............................. C23C 28/042; F01D 5/288
(Continued)

(56) References Cited

U.S. PATENT DOCUMENTS 5,629,251 A * 5/1997 Miyata ...................... C23C 4/10
148/27
5,773,141 A    6/1998 Hasz et al.
(Continued)

FOREIGN PATENT DOCUMENTS

CN    102245810 A    11/2011
CN    102888605 A    1/2013
(Continued)

OTHER PUBLICATIONS

PCT International Search Report and Written Opinion of International Searching Authority dated Apr. 26, 2018 corresponding to PCT International Application No. PCT/US2018/015860 filed Jan. 30, 2018.
(Continued)

*Primary Examiner* — Archene A Turner

(57) ABSTRACT

Materials and a process for forming a protective oxide coating. The high temperature coating system (108) includes at least a thermal barrier coating layer (104) and a thermally stable, deposit resistant protective layer (106) on the thermal barrier coating layer (104).

6 Claims, 2 Drawing Sheets

(51) Int. Cl.
*B33Y 10/00* (2015.01)
*B33Y 40/00* (2020.01)
*B33Y 50/02* (2015.01)
*B23K 26/342* (2014.01)
*B22F 3/24* (2006.01)
*F01D 5/28* (2006.01)
*B22F 10/20* (2021.01)
*B22F 10/30* (2021.01)

(52) U.S. Cl.
CPC .............. *B33Y 10/00* (2014.12); *B33Y 40/00* (2014.12); *B33Y 50/02* (2014.12); *C23C 28/042* (2013.01); *C23C 28/3215* (2013.01); *F01D 5/288* (2013.01); *B22F 10/30* (2021.01); *B22F 2003/247* (2013.01); *B22F 2003/248* (2013.01)

(58) Field of Classification Search
USPC ......................................... 428/697, 701, 702
See application file for complete search history.

(56) References Cited

U.S. PATENT DOCUMENTS

| | | | |
|---|---|---|---|
| 5,851,678 A * | 12/1998 | Hasz | C04B 35/01 428/469 |
| 5,914,189 A | 6/1999 | Hasz et al. | |
| 6,261,643 B1 | 7/2001 | Hasz et al. | |
| 6,465,090 B1 | 10/2002 | Stowell et al. | |
| 6,627,323 B2 | 9/2003 | Nagaraj et al. | |
| 2007/0116883 A1 * | 5/2007 | Gorman | F01D 5/288 427/446 |
| 2007/0151481 A1 * | 7/2007 | Akiyama | C04B 35/16 106/286.6 |
| 2008/0113095 A1 * | 5/2008 | Gorman | C23C 28/345 427/226 |
| 2010/0015401 A1 * | 1/2010 | Bolz | C23C 28/042 428/172 |
| 2010/0158680 A1 * | 6/2010 | Kirby | F01D 5/288 415/200 |
| 2010/0251721 A1 * | 10/2010 | Morrison | F01D 5/147 416/241 B |
| 2011/0300357 A1 | 12/2011 | Witz et al. | |
| 2014/0057129 A1 * | 2/2014 | Cassuto | C09D 5/26 428/623 |
| 2014/0272467 A1 * | 9/2014 | Schaeffer | F01D 25/08 428/697 |

FOREIGN PATENT DOCUMENTS

| | | | |
|---|---|---|---|
| EP | 1788122 A1 | 5/2007 | |
| EP | 1793011 A2 | 6/2007 | |
| EP | 2202212 A2 | 6/2010 | |
| EP | 2778147 A2 | 9/2014 | |
| JP | H10502310 A | 3/1998 | |
| JP | 2008274357 A | 11/2008 | |
| JP | 2015145515 A | 8/2015 | |
| WO | 9631293 A1 | 10/1996 | |
| WO | 9631687 A1 | 10/1996 | |

OTHER PUBLICATIONS

"Engineering Material Use Manual", Editorial Committee, p. 311, Standards Press of China, published in Jul. 2002, the second edition.

\* cited by examiner

THERMAL BARRIER COATING SYSTEM COMPATIBLE WITH OVERLAY

CROSS REFERENCE TO RELATED APPLICATIONS

This International Application claims the benefit of U.S. Provisional Patent Application Ser. No. 62/452,124, filed Jan. 30, 2017, entitled "Thermal Barrier Coating Systems with Compatible Overlay for Improved Deposit Resistance", the entire disclosure of which is incorporated by reference herein in its entirety.

BACKGROUND

1. Field

The present invention relates to high temperature coating materials, and more particularly to an overlay for a thermal barrier coating (TBC) and to processes for making the same.

2. Description of the Related Art

Gas turbines comprise a casing or cylinder for housing a compressor section, a combustion section, and a turbine section. A supply of air is compressed in the compressor section and directed into the combustion section. The compressed air enters the combustion inlet and is mixed with fuel. The air/fuel mixture is then combusted to produce high temperature and high pressure gas. This working gas then travels past the combustor transition and into the turbine section of the turbine.

Generally, the turbine section comprises rows of vanes which direct the working gas to airfoil portions of turbine blades. The working gas travels through the turbine section, causing the turbine blades to rotate, thereby turning a rotor. The rotor is also attached to the compressor section, thereby turning a compressor and also an electrical generator for producing electricity. High efficiency of a combustion turbine is achieved by heating the gas flowing through the combustion section to as high a temperature as is practical. The hot gas, however, may degrade the various metal turbine components, such as the combustor, transition ducts, vanes, ring segments, and turbine blades that it passes when flowing through the turbine.

For this reason, strategies have been developed to protect turbine components from extreme temperatures, such as the development and selection of high temperature materials adapted to withstand these extreme temperatures and cooling strategies to keep the components adequately cooled during operation. One such strategy includes the deposition of a thermal barrier coating (TBC) onto a substrate surface of the component to reduce heat flow to the substrate, and hence reduce the exposure temperature of the underlying substrate. TBCs thus must have high durability in a high temperature service environment. However, as engine operating temperatures increase, the chemical and mechanical interactions between the contaminant compositions and TBCs become more aggressive. For example, molten contaminant compositions can react with the TBCs or can infiltrate its pores and openings, thereby initiating and propagating cracks, and thereby causing delamination and loss of TBC material.

In particular, oxides of calcium, magnesium, aluminum, silicon, titanium, and mixtures thereof may combine to form contaminant compositions referred to as CMAS (Ca—Mg—Al—SiO). The CMAS contaminant compositions may combine with TBC on the engine component to form low melting eutectics and corrosively damage the TBC. These molten contaminant compositions may infiltrate pores of the TBC and, upon cooling, the molten material may solidify as deposits. Iron and nickel oxides in the engine, regardless of whether or not they combine with other CMAS ingredients, can also form detrimental deposits on the TBC and cause TBC failure. The deposit may be a CMAS composition, an oxide rich in nickel and/or iron or combination thereof forming low melting eutectics. When this occurs, cracks may initiate and propagate in the TBC and the strain compliance of the TBC may be reduced, thereby increasing the risk of spallation and loss of the TBC's thermal protection properties.

A number of coating solutions have been proposed for protecting a TBC from CMAS-related damage or the like. Generally, these protective layers or coatings are described as being impermeable, sacrificial, or non-wetting to CMAS. Impermeable coatings are generally characterized as inhibiting infiltration of molten CMAS. Sacrificial coatings react with CMAS to increase the melting temperature and viscosity of CMAS, thereby inhibiting infiltration of the modified CMAS into an associated TBC. Non-wetting coatings reduce the attraction between the solid TBC and molten CMAS in contact therewith to reduce the infiltration of the CMAS into the TBC. For exemplary protective coating systems, see U.S. Pat. Nos. 6,720,038; 6,627,323; 6,465,090; 5,914,189; 5,871,820; 5,773,141; and 5,660,885.

SUMMARY

In one aspect of the present invention, a high temperature coating system comprises: a thermal barrier coating layer; and a thermally stable, deposit resistant protective layer on the thermal barrier coating layer.

In another aspect of the present invention, a component comprises: a substrate; a thermal barrier coating layer on the substrate; and a thermally stable, deposit resistant protective layer on the thermal barrier coating layer.

These and other features, aspects and advantages of the present invention will become better understood with reference to the following drawings, description and claims.

BRIEF DESCRIPTION OF THE DRAWINGS

The invention is shown in more detail by help of figures. The figures show preferred configurations and do not limit the scope of the invention.

DETAILED DESCRIPTION

In the following detailed description of the preferred embodiment, reference is made to the accompanying drawings that form a part hereof, and in which is shown by way of illustration, and not by way of limitation, a specific embodiment in which the invention may be practiced. It is to be understood that other embodiments may be utilized and that changes may be made without departing from the spirit and scope of the present invention.

Broadly, an embodiment of the present invention provides a high temperature coating system comprises: a thermal barrier coating layer; and a thermally stable, deposit resistant protective layer on the thermal barrier coating layer.

Figure 1:
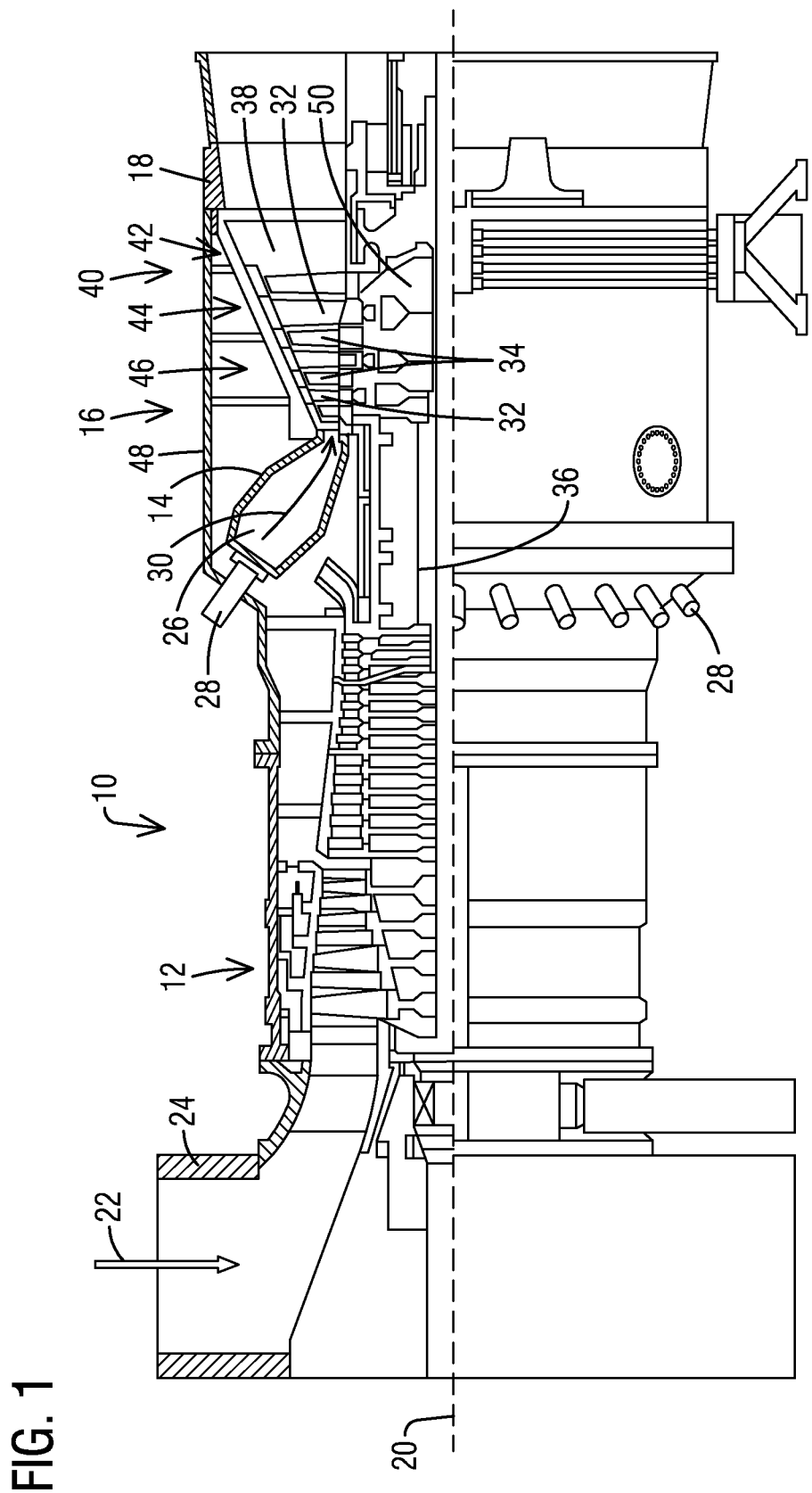
FIG. 1 is a cross-sectional view of a gas turbine in accordance with an aspect of the present invention.

Referring to FIG. 1, as an example, a gas turbine engine 10 may comprise a compressor section 12, a combustor section 14, a turbine section 16, and an exhaust casing 18. The compressor section 12 compresses ambient air 22 after entering through an intake housing 24. The combustor section 14 combines the compressed air 22 with a fuel and ignites the mixture creating combustion products comprising hot gases that form a working fluid 30. The combustor section 14 includes a combustion chamber 26, in particular an annular combustion chamber, with a plurality of coaxially arranged burners 28. The working fluid 30 travels to the turbine section 16. Within the turbine section 16 are circumferential alternating rows 44 of guide vanes 32 and rows 42 of rotor blades 42 respectively, the blades 34 being coupled to a rotor 36. The turbine section 16 comprises a fixed turbine casing, which houses the vanes 32, blades 34 and rotor 36. A blade 34 of a gas turbine receives high temperature working fluid 30 from the combustor section 14 in order to produce mechanical work of a shaft rotation to a generator or machine (not shown).

The compressor section 12 intakes the ambient air 22 through the intake housing 24 and compresses the air 22. The compressed air leaving the compressor section 12 at a turbine side end of the compressor section 12 is passed to the burners 28 where the air is then mixed with fuel. Then, within the combustion chamber 26 of the combustor section 14, the mixture is burned to form the working fluid 30. The working fluid 30, during operation, then moves through a hot gas duct 38 that includes multiple successive turbine stages 40. The working fluid 30 flows past the guide vanes 32 and the rotor blades 34. The guide vanes 32 are secured to an inner housing 46 of a stator 48. The rotor blades 34 are fitted to the rotor 36 by something like a turbine disc 50. The working fluid 30 expands at the rotor blades 34, transferring momentum so that the rotor blades 34 drive the rotor 36 and the rotor 36 drives the machine coupled to the rotor 36.

Figure 2:
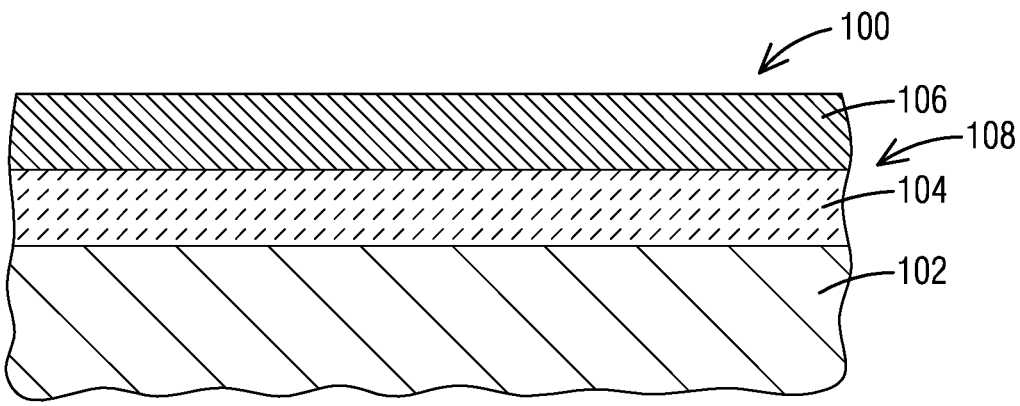
FIG. 2 illustrates a coating system in accordance with an aspect of an exemplary embodiment of the present invention.
Figure 3:
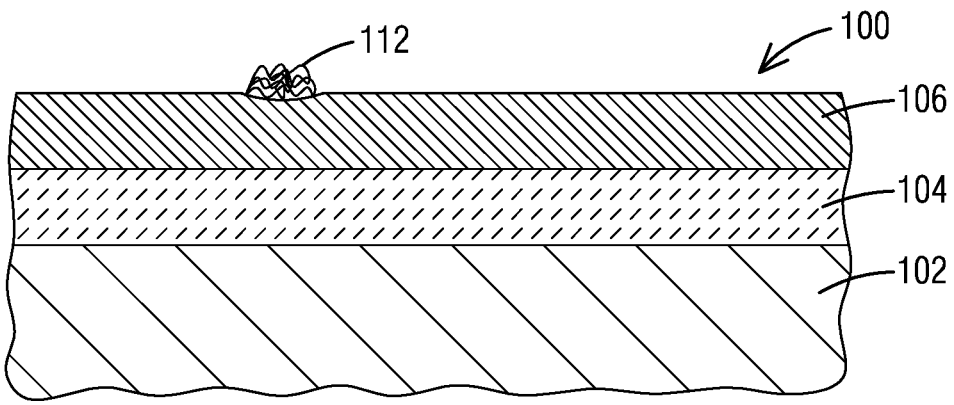
FIG. 3 illustrates another coating system in accordance with an aspect of an exemplary embodiment of the present invention.

FIG. 2 shows a partial cross-sectional view of a component 100. The component 100 can be any desired component such as a gas turbine component described above and shown in FIG. 1. For example, the component 100 may include a component in a hot gas path of the turbine, such as a blade, a vane, a transition piece, or the like. It is understood that the current invention is not limited to this example. The component 100, as an example, can be a turbine blade 34 or a guide vane 32. As can be seen in FIG. 2, the component includes a substrate 102 with a thermal barrier coating (TBC) 104 thereon, and a thermally stable, deposit resistant protective coating layer 106 on the TBC 104. In this embodiment, the TBC 104 and the thermally stable, deposit resistant protective coating layer 106 can be collectively referred to as a coating system 108 for the substrate 102. The thermally stable, deposit resistant protective coating layer 106 reduces or eliminates infiltration of CMAS and other detrimental deposits into the TBC 104. CMAS is shown as an example of such deposits 112 in FIG. 3 and throughout the application. FIG. 3 shows the TBC 104 disposed over the substrate 102 while the protective coating layer 106 is disposed over the TBC 104 such that the thermally stable, deposit resistant protective coating layer 106 is rendered the outermost layer of the component 100. Due to the configuration, deposits 112 encounter the thermally stable, deposit resistant protective coating layer 106 first. The term thermally stable refers to operational temperature ranges of the gas turbine engine as is known in the art.

The substrate 102 may be formed from any suitable material which would benefit from the TBC 104 and thermally stable, deposit resistant protective coating layer 106 described herein. In certain embodiments, the substrate 102 includes a superalloy material. The term "superalloy" is used herein as it is commonly used in the art to refer to a highly corrosion-resistant and oxidation-resistant alloy that exhibits excellent mechanical strength and resistance to creep even at high temperatures.

In some other embodiments, the substrate 102 may be include a ceramic matrix composite (CMC) material as is known in the art. The CMC material may include a ceramic or a ceramic matrix material, each of which hosts a plurality of reinforcing fibers. In certain embodiments, the CMC material may be anisotropic, at least in the sense that it can have different strength characteristics in different directions. It is appreciated that various factors, including material selection and fiber orientation can affect the strength characteristics of a CMC material. In addition, the CMC material may comprise an oxide or a non-oxide CMC material. In an embodiment, the CMC material may include an oxide-oxide CMC material as is known in the art.

The TBC 104 may comprise any suitable TBC material which provides a degree of thermal protection to the underlying substrate 102. In an embodiment, the TBC material comprises a stabilized zirconia material as is known in the art, such as an yttria-stabilized zirconia (YSZ) material. In other embodiments, the zirconia may instead or partially be stabilized with other oxides, such as magnesia, ceria, scandia, or any other suitable oxide material. An exemplary YSZ material includes zirconium oxide ($ZrO_2$) with a predetermined concentration of yttrium oxide ($Y_2O_3$), pyrochlores, or the like. In certain embodiments, the TBC 104 may comprise a columnar microstructure, which may be provided via a physical vapor deposition (PVD) process such as electron beam PVD (EBPVD), or a non-columnar microstructure. Typically, the TBC 104 includes a degree of porosity, and thus is susceptible to spallation due to deposit 112 infiltration as was described above. The TBC 104 may also have any suitable thickness for the intended application.

Figure 4:
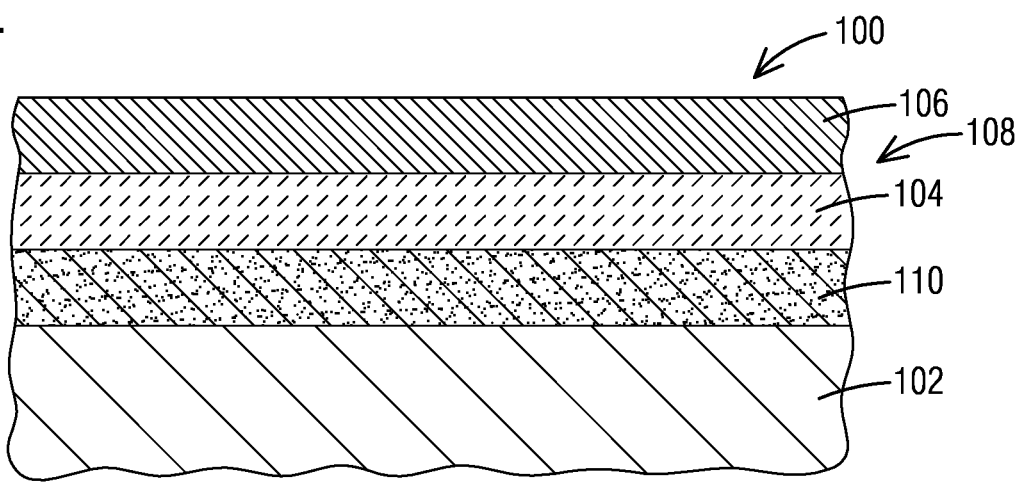
FIG. 4 illustrates another coating system in accordance with an aspect of an exemplary embodiment of the present invention.

In certain embodiments, as shown in FIG. 4, the coating system 108 may further include a bond coating layer 110 between the TBC 104 and the substrate 102 in order to improve adhesion of the TBC 104 to the substrate 102, and to reduce the likelihood of oxidation of the underlying substrate 102. The thermally stable, deposit resistant protective coating layer 106 is again deposited over the TBC 104. Alternatively, the bond coating layer 110 between the TBC 104 and the substrate 102 may be omitted, and the TBC 104 may be applied directly onto a surface of the substrate 102 as was shown in FIGS. 2-3. The bond coating layer 110 may comprise any suitable material for its intended purpose. An exemplary bond coating layer 110 comprises an MCrAlY material, where M denotes nickel, cobalt, iron, or mixtures thereof, Cr denotes chromium, Al denotes aluminum, and Y denotes yttrium. Another exemplary bond coating layer 110 for use herein comprises alumina. The bond coating layer 110 may be applied to the substrate 102 by any known process, such as sputtering, plasma spray, or vapor deposition, e.g., electron beam physical vapor deposition (EBPVD), or the like.

Potential layers deposited over the TBC 104 tend to be dense and based on materials that have a large difference in the coefficient of thermal expansion (CTE) with the common TBC materials such as YSZ mentioned above. For example, Alumina appears as a constituent in a CMAS resistant protective coating layer. Alumina, an oxide of aluminum, has a CTE of around $7\text{-}8\times10^{-6}/°$ C. when the CTE of 6-8 wt % YSZ is much larger at around $10\text{-}11\times10^{-6}/°$ C. This difference in the CTE can cause thermal strains within the TBC coating system during cycling, especially for the alumina layer that is dense and/or thick. Partial or complete spallation of the protective later can occur, thus losing its functionality. Additionally, the spallation of a strongly adhering protective layer can often cause spallation of the underlying TBC layer that leaves the metallic component partially or fully exposed to the high temperature environment.

In order to reduce the CTE mismatches and the resulting thermal mismatch stresses, the thermally stable, deposit resistant protective coating layer 106 can be used. One such thermally stable, deposit resistant material is forsterite that is a magnesium-rich end-member of the olivine solid solution series with the formula of $Mg_2SiO_4$. A chemically stable oxide, forsterite has a melting point around 1900° C. with a thermal conductivity of 3.8 W/mk. Additionally, the CTE of forsterite (approximately $10\times10^{-6}/°$ C.) closely matches with that of 6-8 wt % YSZ. The thickness can be tailored to desired component characteristics.

Forsterite in a pure or doped configuration can be used as the material for the thermally stable, deposit resistant protective coating layer 106. Additionally, non-stoichiometric compositions of forsterite can further reduce the thermal mismatch. Non-stoichiometric compositions of forsterite including excess of magnesia (MgO) can further reduce the thermal mismatch. Compositions can be selected in order to fine tune the CTE to match closely with the underlying TBC layer material, thus minimizing or eliminating the CTE mismatch.

The main constituents from CMAS that can react with TBCs are Ca and Si. Being a silicate, forsterite can provide added protection that can seal the reaction between the CMAS and TBC. Other thermally stable, CMAS resistant materials such as Magnesium aluminate spinel ($MgAl_2O_4$) can be applied instead of the forsterite as a protective coating layer 106. Here, a non-stoichiometric composite of Magnesium aluminate spinel ($MgO$—$MgAl_2O_4$) can be particularly suitable because its CTE can be adjusted to match the underlying TBC layer.

Using the thermally stable, deposit resistant protective coating layer 106, the CTE mismatch and resulting thermal stresses with the TBC coating system subjected to thermal cycling, can be reduced. The addition of the thermally stable, deposit resistant protective coating layer 106 allows for the prevention or delay of spallation of the protective layer, thus prolonging the life and functionality of the protective layer. The prevention of spallation of the protective layer can in turn prevent the spallation of the underlying TBC layer.

The thermally stable, deposit resistant protective coating layer 106 may be applied to the TBC 104 by any known process, such as thermal spray, plasma spray, coating, air brushing, or vapor deposition, e.g., electron beam physical vapor deposition (EBPVD), or the like.

While specific embodiments have been described in detail, those with ordinary skill in the art will appreciate that various modifications and alternative to those details could be developed in light of the overall teachings of the disclosure. Accordingly, the particular arrangements disclosed are meant to be illustrative only and not limiting as to the scope of the invention, which is to be given the full breadth of the appended claims, and any and all equivalents thereof.

What is claimed is:

1. A high temperature coating system comprising:
   a thermal barrier coating layer comprising a yttria-stabilized zirconia and a columnar microstructure; and
   a thermally stable, deposit resistant protective layer on the thermal barrier coating layer,
   wherein the thermally stable, deposit resistant protective layer material is pure forsterite or doped forsterite.

2. The coating system according to claim 1, wherein the deposit is a composition of oxides of calcium, magnesium, aluminum, silicon, titanium, and mixtures thereof (CMAS), an oxide rich in nickel and/or iron or a combination.

3. A component, comprising:
   a substrate;
   a thermal barrier coating layer on the substrate, the thermal barrier coating layer comprising a yttria-stabilized zirconia and a columnar microstructure; and
   a thermally stable, deposit resistant protective layer on the thermal barrier coating layer,
   wherein the thermally stable, deposit resistant protective layer material is pure forsterite or doped forsterite.

4. The component according to claim 3, wherein the deposit is a composition of oxides of calcium, magnesium, aluminum, silicon, titanium, and mixtures thereof (CMAS), an oxide rich in nickel and/or iron or a combination.

5. The component according to claim 3, wherein the component comprises a gas turbine rotor blade.

6. The component according to claim 3, wherein the component comprises a gas turbine stationary guide vane.

* * * * *